United States Patent
Joo et al.

(10) Patent No.: US 8,217,385 B2
(45) Date of Patent: Jul. 10, 2012

(54) ORGANIC MEMORY DEVICE AND FABRICATION METHOD THEREOF

(75) Inventors: Won Jae Joo, Hwaseong-si (KR); Sang Kyun Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 771 days.

(21) Appl. No.: 11/606,888

(22) Filed: Dec. 1, 2006

(65) Prior Publication Data

US 2007/0176189 A1    Aug. 2, 2007

(30) Foreign Application Priority Data

Feb. 2, 2006    (KR) .................. 10-2006-0010089

(51) Int. Cl.
*H01L 51/30* (2006.01)

(52) U.S. Cl. ......... 257/40; 257/2; 257/642; 257/E51.01; 257/E51.013; 257/E51.015; 257/E51.017

(58) Field of Classification Search ............ 257/90, 257/40, E51.005–E51.007, 2, 642, E51.01, 257/E51.013, E51.015, E51.017
See application file for complete search history.

(56) References Cited

U.S. PATENT DOCUMENTS

| | | | | |
|---|---|---|---|---|
| 5,903,296 | A * | 5/1999 | Shimizu et al. | 347/139 |
| 7,075,105 | B2 * | 7/2006 | Kano | 257/40 |
| 7,122,853 | B1 * | 10/2006 | Gaun et al. | 257/295 |
| 7,208,757 | B1 * | 4/2007 | Kingsborough et al. | 257/40 |
| 7,265,379 | B2 * | 9/2007 | Sandberg et al. | 257/40 |
| 7,274,035 | B2 * | 9/2007 | Yang et al. | 257/27 |
| 7,544,966 | B2 * | 6/2009 | Yang et al. | 257/40 |
| 2002/0163057 | A1 | 11/2002 | Bulovic et al. | |
| 2004/0027849 | A1 | 2/2004 | Yang et al. | |
| 2008/0089113 | A1 * | 4/2008 | Yang et al. | 365/153 |

FOREIGN PATENT DOCUMENTS

JP    62-095882    5/1987

OTHER PUBLICATIONS

Y. Seugui et al., "Switching in Polystyrene Films: Transition From on to Off State" J. Appl. Phys., vol. 47, No. 1, Jan. 1, 2976.

Liping Ma et al., "Organic Nonvolatile Memory by Controlling the Dynamic Copper-Ion Concentration Within Organic Layer" Applied Physics Letters, vol. 84, No. 24, Jun. 14, 2004.

* cited by examiner

*Primary Examiner* — Minchul Yang
(74) *Attorney, Agent, or Firm* — Harness, Dickey & Pierce, P.L.C.

(57) ABSTRACT

Disclosed herein are an organic memory device and a method for fabricating the device. The organic memory device may include a first electrode, a second electrode and an organic active layer wherein the organic active layer includes an upper organic material layer formed of an electrically conductive organic material containing heteroatoms and a lower organic material layer formed of an electrically non-conductive organic material containing heteroatoms. Because the organic memory device exhibits improved thermal stability and non-volatility, it may be well suited for use in nonvolatile large-capacity storage units. Flexible electrodes may be used in the organic memory device to fabricate flexible memory devices.

16 Claims, 5 Drawing Sheets

<Formation of organic active layer>

<Diffusion of metal ions>

● : metal ions

<Application of positive voltage>

<Application of negative voltage>

ORGANIC MEMORY DEVICE AND FABRICATION METHOD THEREOF

This non-provisional application claims priority under 35 U.S.C. §119 to Korean Patent Application No. 2006-10089, filed on Feb. 2, 2006, in the Korean Intellectual Property Office (KIPO), the entire contents of which are herein incorporated by reference.

BACKGROUND

1. Field

Example embodiments relate to an organic memory device and a method for fabricating the device. Other example embodiments relate to an organic memory device including a first electrode, a second electrode and upper and lower organic material layers provided between the first and second electrodes wherein the upper organic material layer may be formed of an electrically conductive organic material containing heteroatoms and the lower organic material layer may be formed of an electrically non-conductive organic material containing heteroatoms, and a method for fabricating the organic memory device.

2. Description of the Related Art

With the recent dramatic developments in digital communication technology, demand for a variety of memory devices has been increasing rapidly. In particular, non-volatile memory devices suitable for use in applications including, for example, mobile terminals, smart cards, electronic money, digital cameras, game memories and/or MP3 players, and others, are required for retaining data in memory even when no power is being applied to the memory device, thereby tending to reduce the memory-related power consumption of the device.

Perhaps the most common nonvolatile memories currently being utilized in such applications are flash memories based on silicon materials. Conventional flash memories, however, have inherent technical limitations in that the number of writing/erasing cycles is limited, the writing speed is relatively slow, the production costs of memory chips may be increased as a result of the complicated processing currently required for attaining sufficiently high memory densities and certain physical limitations that impede further efforts toward miniaturization. In view of these known limitations of conventional flash memories and the processes for fabricating such devices, efforts have continued toward developing next-generation nonvolatile memory devices that may overcome at least certain of the limitations associated with conventional silicon memory devices and provide one or more advantages over the conventional devices including, for example, increased operating speeds, increased density and/or capacity, reduced power consumption and/or reduced production costs.

Some of these next-generation nonvolatile memories may be generally categorized as, for example, ferroelectric RAMs, magnetic RAMs, phase change RAMs, nanotube memories, holographic memories, organic memories, and/or other groupings that tend to reflect the particular constituent materials used in forming the primary memory cells and/or the particular configuration of the materials and/or structures within the memory cells utilized in the semiconductor memory devices. Organic memories, for example, typically include an upper electrode, a lower electrode and a memory layer formed from an organic material positioned between the upper and lower electrodes to utilize the bistability of resistance values obtained when a voltage is applied between the upper and lower electrodes for storing data.

As utilized in organic memory devices, these bistability resistance characteristics are exhibited by memory cells formed at the intersections or interfaces between the upper and lower electrodes. Accordingly, these organic memories allow the resistance of the organic material positioned between the upper and lower electrodes to be varied repeatedly between higher and lower values through application of appropriate voltage potentials so that data, e.g. '0' and '1', may be written to and read from a single cell. Such organic memory devices have attracted increasing attention in recent years as next-generation memories because they provide the desired non-volatility, which may be an advantage associated with conventional flash memories, while also providing improved processability, reducing fabrication costs and/or improving the degree of integration.

One example of such an organic memory utilizes 7,7,8,8-tetracyano-p-quinodimethane (CuTCNQ), which is an organometallic charge transfer complex compound, as the organic material. Another example includes semiconductor devices including an upper electrode, a lower electrode and an intermediate layer therebetween wherein the intermediate layer may be formed from a mixture of an ionic salt, e.g., NaCl and/or CsCl, and a conductive polymer.

Other work has suggested an organic memory devices including organic active layers and a metal nanocluster applied between the organic active layers, but efforts in this area have been hampered by relatively low yields, difficulties in forming suitable metal nanoclusters, and reset voltages of about 0 V, rendering such devices generally unsuitable for widespread use as a nonvolatile organic memory.

Metal filament memories are currently being investigated as next-generation memories in which the resistance values may be varied by the formation and dissolution, attenuation or removal of metal filaments within an organic material layer between two electrodes. The advantages associated with such metal filament memories may be reduced fabrication costs, the potential for forming three-dimensional stacking structures, increased retention time, improved thermal stability and/or increased compatibility with flexible substrates. For example, polystyrene films formed from styrene vapor by a glow discharge polymerization technique have shown memory characteristics associated with the formation of metal filaments. Unlike metal filaments formed by a glow discharge polymerization technique, however, the formation of metal filaments within polystyrene films has not been demonstrated using more conventional coating techniques, e.g., spin coating or spin casting.

On the other hand, nonvolatile memory characteristics have been achieved in a metal filament memory device including an upper copper electrode, a lower copper electrode and an organic material layer formed of a material selected from 2-amino-4,5-imidazoledicarbonitrile (AIDCN), tris-8-(hydroxyquinoline) aluminum (Alq3) and/or zinc 2,9,16,23-tetra-tert-butyl-29H,31H-phthalocyanine (ZnPC). In each of these metal filament memories, however, the organic active layers of the conventional metal filament memory devices are formed using vacuum evaporation, and thereby requiring complicated fabrication processing and tending to increase fabrication costs relative to other conventional methods of forming organic layers, e.g., spin-coating.

SUMMARY

Example embodiments are provided below for addressing certain of the deficiencies and/or limitations of the prior art memory devices through the manufacture and use of organic memory devices. Example embodiments of methods which may be used to fabricate such organic memory devices using less complicated and/or less expensive fabrication processes including, for example, spin coating or spin casting, are also provided.

Example embodiments include organic memory devices including a first electrode, a second electrode and an organic active layer wherein the organic active layer includes an upper organic material layer formed from an electrically conductive organic material containing heteroatoms and a lower organic material layer formed from an electrically non-conductive organic material containing heteroatoms.

Example embodiments of the organic active layers fabricated from such materials will typically exhibit an electrical conductivity of about $10^{-12}$ S/cm or greater and will generally include sulfur (S) and/or nitrogen (N) atoms as the heteroatoms. The electrically conductive organic material may be a polymer, a copolymer, a higher order polymer, a single molecule, an oligomer, an ionomer or a dendrimer or mixtures thereof. As the polymer, there may be used, for example, a homopolymer, a random copolymer, a graft copolymer, a star-block copolymer and/or a mixture of different polymers.

Example embodiments of suitable electrically conductive polymers containing heteroatoms include, for example, aniline homopolymers and copolymers, pyrrole homopolymers and copolymers and/or vinylpyridine homopolymers and copolymers. Example embodiments of specific materials within these broader classifications include, for example, poly-3-hexylthiophene, polypyrrole, polysiloxane carbazole, polyaniline, poly(1-methoxy-4-(O-disperse red 1))-2,5-phenylene-vinylene and mixtures thereof.

Any electrically non-conductive organic material containing heteroatoms may be used without any particular limitation in example embodiments so long as it contains heteroatoms and may be electrically non-conductive. Examples of electrically non-conductive organic materials may include poly(4-vinylpyridine), poly(2-vinylpyridine), polystyrene-co-vinylpyridine, polystyrene sulfonic acid, polyacrylamide and/or poly(N-vinylimidazole).

Example embodiments of methods for fabricating organic memory devices may include a first electrode, a second electrode and an organic active layer therebetween, the method including forming a lower organic material layer on the second electrode formed on a substrate, and forming an upper organic material layer on the lower organic material layer wherein the lower organic material layer may be formed of an electrically non-conductive organic material containing heteroatoms and the upper organic material layer may be formed of an electrically conductive organic material containing heteroatoms.

BRIEF DESCRIPTION OF THE DRAWINGS

Example embodiments will be more clearly understood from the following detailed description taken in conjunction with the accompanying drawings.

FIG. 1 is a diagram of an organic memory device according to example embodiments;

FIG. 2 is a diagram of a memory matrix employing a memory device according to example embodiments;

FIG. 3 provides a series of diagrams illustrating the mechanism of switching utilizing the formation of metal filaments in an organic memory device of example embodiments;

FIG. 4 is a graph showing the current-voltage (I-V) characteristics of an organic memory device fabricated as described in Example 1;

FIG. 5 is a graph showing the current-voltage (I-V) characteristics of an organic memory device fabricated as described in Example 2;

FIG. 6 is a graph showing the current-voltage (I-V) characteristics of an organic memory device fabricated as described in Example 3;

FIG. 7 is a graph showing the current-voltage (I-V) characteristics of an organic memory device fabricated as described in Comparative Example 1;

FIG. 8 is a graph showing the current-voltage (I-V) characteristics of an organic memory device fabricated as described in Comparative Example 2; and FIG. 9 is a graph showing changes in current in response to a voltage applied to an organic memory device fabricated as described in Comparative Example 2.

Figure 1:
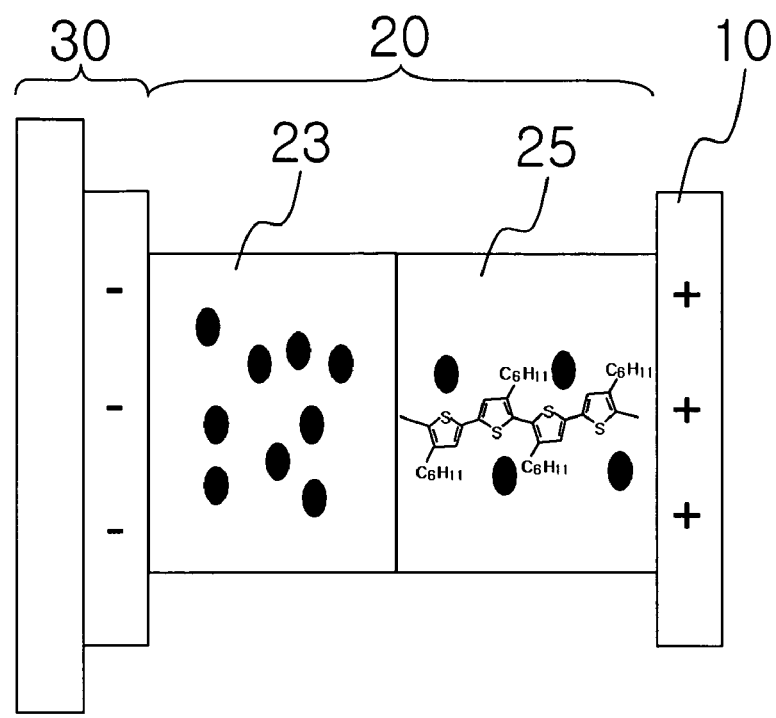
FIGS. 1-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DESCRIPTION OF EXAMPLE EMBODIMENTS

Example embodiments will now be described in greater detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "organic memory device" generally describes a memory device including a first electrode, a second electrode and an organic active layer provided between the electrodes that may be operated to store data by inducing changes in the resistance of the organic active layer associated with the formation and dissolution, attenuation or removal of metal filaments within the organic active layer.

Example embodiments relate to an organic memory device including a first electrode, a second electrode and an organic active layer provided between wherein the organic active layer may include an upper organic material layer formed from an electrically conductive organic material that contains heteroatoms and a lower organic material layer formed from an electrically non-conductive organic material that contains heteroatoms. When the electrically conductive organic material is a polymer, each repeating unit of the polymer has at least one heteroatom.

FIG. 1 is a diagram of an organic memory device according to example embodiments. With reference to FIG. 1, the organic memory device may include a first electrode 10, a second electrode 30 and an organic active layer 20 provided between the first and second electrodes. The resistance values of the organic active layer 20 obtained when a voltage may be applied to the memory device 100 may exhibit bistability, e.g., the organic active layer can exhibit two distinct stable conductivity states at the same applied voltage, that may be utilized as the memory characteristics of the memory device. The memory characteristics inherent in the organic active layer, these characteristics are maintained in the absence of applied voltage and are suitable for use in non-volatile memory devices.

Metal filaments may begin to grow from the first electrode 10 of the organic memory device. Accordingly, an upper organic material layer 25 may be formed using an electrically conductive organic material containing heteroatoms while in contact with the first electrode 10. The use of an inexpensive electrically non-conductive organic material containing heteroatoms as a material for a lower organic material layer 23 may allow metal filaments to be readily formed, may ensure sufficient memory characteristics, and may contribute to a reduction in fabrication costs. When the heteroatoms contained in the constituent organic material of the lower organic material layer 23 are different from those contained in the constituent organic material of the upper organic material layer 25, more stable switching of the memory device may occur.

Figure 2:
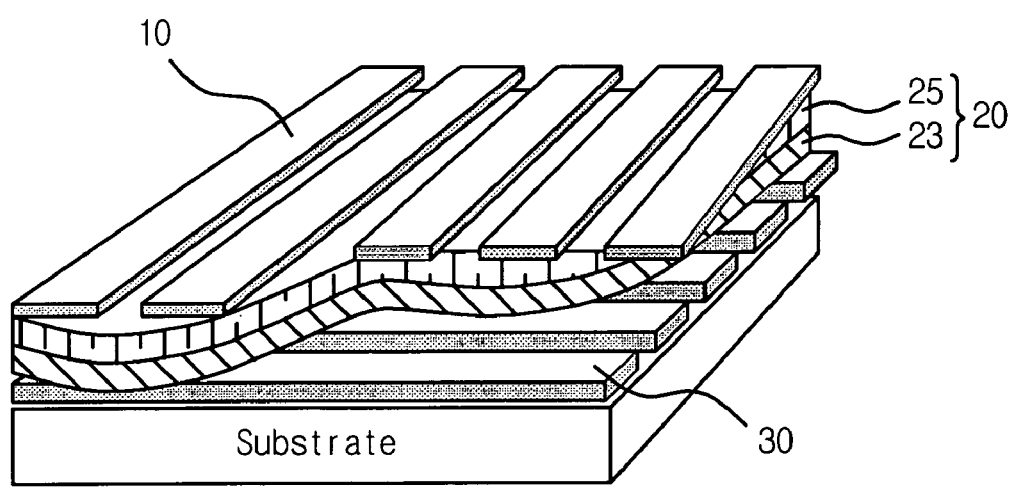

FIG. 2 is a diagram of an exemplary memory matrix employing the memory device of example embodiments. As illustrated in FIG. 2, the memory cell matrix includes memory cells defined by overlapping portions of the first and second electrodes 10, 30 and the portion of the organic active layer 20 that extends therebetween. As noted above, the material used in forming the organic active layer 20 is a composition that exhibits the desired bistability characteristics.

As noted above, the material used in forming the substrate is not particularly limited and may include conventional organic and/or inorganic materials, for example, glass, silicon, surface-modified glass, polypropylene, activated acrylamide and/or combinations thereof and may be configured as a rigid, semirigid or flexible substrate. Without being bound by theory, it is believed that the switching and memory phenomena of example embodiments of the organic memory devices may be attributed to the formation and dissolution, attenuation or removal of metal filaments within the organic metal layer 20.

Figure 3:
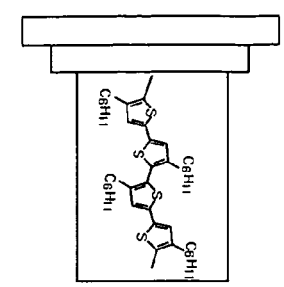
Figure 3:
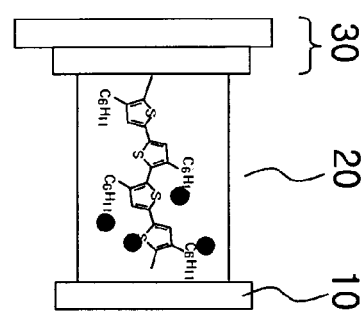
Figure 3:
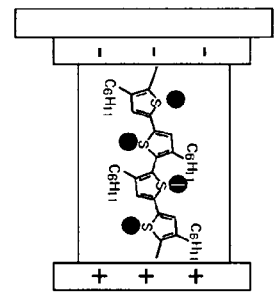
Figure 3:
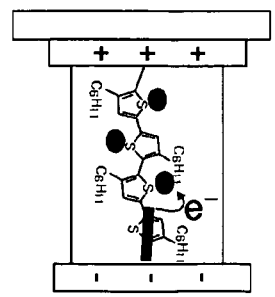

FIG. 3 illustrates a proposed operating mechanism for example embodiments of the organic memory devices. As illustrated in FIG. 3, a second electrode 30 coated with a conductive material may be formed on a substrate (not shown). Thereafter, an organic active layer, which includes a lower organic material layer 23 formed of an electrically non-conductive organic material containing heteroatoms and an upper organic material layer 25 formed of an electrically conductive organic material containing heteroatoms, may be deposited on a major surface of the second electrode 30. A first electrode 10 may be formed on the organic active layer, after which components, for example, metal ions, from the first electrode 10 may be diffused into the organic active layer 20. Alternatively, some or all of the desired metal ions may be incorporated in the organic material composition that is applied to the second electrode to form the organic active layer, thereby reducing or eliminating the need for metal ion diffusion from the first electrode.

When a positive voltage is applied between the first and second electrodes 10 and 30, the heteroatoms contained in the electrically conductive organic material constituting the upper organic material layer 25 and the heteroatoms contained in the electrically non-conductive organic material constituting the lower organic material layer 23 may interact with metal ions diffused from the first electrode 10 to form complexes. The heteroatoms contained in the electrically conductive organic material constituting the upper organic material layer 25 and the heteroatoms contained in the electrically non-conductive organic material constituting the lower organic material layer 23 may act as bases relative to the metal ions diffused from the first electrode 10 so that they may react with the metal ions to form complexes.

According to a model based on the hard-soft acid-base principle, it may be known that a hard acid predominantly reacts with a hard base and a soft acid predominantly reacts with a soft base to form respective complexes. Without being bound by theory, it is further believed that the heteroatoms present in the organic material will tend to become coordinated with the metal ions through lone pairs of electrons present therein. Without being bound by theory, it is believed that the heteroatoms contained in the electrically conductive and non-conductive organic materials and the complexes or chelates that the heteroatoms may form with, the metal ions diffusing from the electrode under the influence of a positive voltage will tend to improve the uniformity of the distribution of the metal ions throughout the organic materials. Accordingly, under the influence of a negative voltage these metal ions will be reduced and will tend to form generally uniformly distributed metal filaments throughout the organic material, thereby improving the conductivity of the organic material.

The formation of metal filaments between the first and second electrodes depends to some degree on the ability of the bound and/or complexed metal ions to be reduced to form metal filaments within the organic material. Accordingly, the material used in forming the upper organic material layer may be electrically conductive. The organic materials of the organic material layers may have a sufficient number and distribution of metal or complexing linkable sites, e.g., heteroatoms, whereby the metal ions will be distributed generally uniformly throughout the organic material layers. Accordingly, those materials that exhibit both sufficient electrical conductivity and metal linkable sites may generally be utilized in a metal filament memory, whereas those materials that may be electrically non-conductive and/or do not incorporate sufficient numbers of metal linkable sites will not tend to show an adequate memory phenomenon to be utilized in a metal filament memory. It is believed, for example, that those electrically conductive organic materials exhibiting an electrical conductivity of about $10^{-12}$ S/cm or greater and a sufficient number of metal linking sites, for example, the heteroatoms sulfur (S) and/or nitrogen (N) atoms, may generally be suitable for use in metal filament memories.

When an appropriate electrical voltage is applied between the two electrodes of example embodiments of the memory devices, the organic active layer may be switched between a higher resistance state and a lower resistance state. The state or condition in which metal filaments are formed between the first and second electrodes may become a lower resistance set state, and the state wherein metal filaments are dissolved or removed may become a higher resistance reset state. Assuming that the lower resistance state may be defined as data "1" and the higher resistance state may be defined as data "0", two logic states of the data may be stored in each memory cell.

The configuration of the example embodiments of the electrically conductive organic materials containing heteroatoms that may be used in forming the organic active layers may be a polymer, a copolymer or higher order polymer, a single molecule, an oligomer, an ionomer, a dendrimer and mixtures thereof.

As used herein, the term dendrimers refers to branched or tree-like structures that possess internal cavities and external reactive groups capable of reacting with various chemical units. The growth stages of dendrimers may be represented as "generations". The successive addition of repeating units may form the next generations (e.g., "first generation" and/or "second generation"). The molecular weight and surface functional groups of dendrimers may be completely controlled during synthesis of the dendrimers, unlike in other polymers, e.g., polyethylene and/or polypropylene. Dendrimers may be synthesized in a stepwise manner by repeating two or three chemical reactions ("divergent synthesis method"). The dendrimers synthesized in this manner may be configured to have the numbers and types of one or more surface functional groups in the outer generation(s) as desired and/or necessary for a particular application. The electrically conductive organic material containing heteroatoms may be a polymer selected from homopolymers, random copolymers, terpolymers, higher order polymers, graft copolymers, star-block copolymers and mixtures thereof.

Example embodiments of electrically conductive polymers containing heteroatoms that may be used in forming organic active layers include, for example, aniline homopolymers and copolymers, pyrrole homopolymers and copolymers, vinylpyridine homopolymers and copolymers and mixtures thereof. Specific examples of electrically conductive organic materials containing heteroatoms may include, for example, poly-3-hexylthiophene, polypyrrole, polysiloxane carbazole, polyaniline, poly(1-methoxy-4-(O-disperse red 1))-2,5-phenylene-vinylene, polyindole, polycarbazole, polypyridiazine, polyisothianaphthalene, polyphenylene sulfide, polyvinylpyridine, polypyridine and mixtures thereof.

The range of non-polymeric molecules that may be utilized in forming organic active layers is not especially limited so long as the molecule(s) include sufficient numbers of heteroatoms and may be sufficiently conductive. Example embodiments of such molecules include, for example, phthalocyanine and molecules having a structure in which a conductive moiety, e.g., carbazole, triphenylamine and/or triphenyldiamine, may be chemically bonded to a heteroatom-containing moiety, e.g., a nitro, azo, indigo and/or thioindigo dye.

Any electrically non-conductive organic material containing heteroatoms constituting the lower organic material layer 23 may be used without any particular limitation so long as it contains heteroatoms and may be electrically non-conductive. Examples of electrically non-conductive organic materials include poly(4-vinylpyridine), poly(2-vinylpyridine), polystyrene-co-vinylpyridine, polystyrene sulfonic acid, polyacrylamide and/or poly(N-vinylimidazole). As will be appreciated by those skilled in the art, the first electrode 10, from which metal ions may be diffused into the organic active layer, will typically comprise one or more metals that may be readily diffused through the organic material(s). Examples of such diffusive metals include, for example, gold, silver, platinum, copper, cobalt, nickel, tin, aluminum and alloys and mixtures thereof. The diffusing metal(s) may be, for example, incorporated into the bulk material of the first electrode, be provided on a primary conductor in a damascene or other recessed pattern and/or provided as a diffusion layer on a primary conductor.

The second electrode 30 may be made of at least one electrically conductive material selected from the group consisting of metals, metal alloys, metal nitrides, metal oxides, metal sulfides, carbon polymers, conductive polymers and/or organic conductors. Specific examples of materials for the second electrode may include, but may not be limited to, aluminum (Al), gold (Au), silver (Ag), platinum (Pt), copper (Cu), titanium (Ti), tungsten (W), indium tin oxide (ITO), as well as alloys, mixtures and combinations thereof.

The organic memory device of example embodiments may further include a barrier layer formed under the first electrode or on the second electrode to prevent or reduce damage to the first and/or second electrode resulting from attacks, e.g., dissolution, erosion and/or corrosion, resulting from reactions between the organic materials. If utilized, the barrier layer may be formed from a material selected from the group consisting of $SiO_x$, $AlO_x$, $NbO_x$, $TiO_x$, $CrO_x$, $VO_x$, $TaO_x$, $CuO_x$, $MgO_x$, $WO_x$, $AlNO_x$ and combinations thereof, for example, $SiO_2$, $Al_2O_3$, $Cu_2O$, $TiO_2$ and/or $V_2O_3$. The barrier layer may also be formed of an organic material, e.g., Alq3, polymethylmethacrylate, polystyrene and/or PET. The barrier layer should be formed to a thickness and exhibit a uniformity sufficient to provide a satisfactory degree of protection to the electrode during the expected operational life of the final devices. For example, a barrier layer having a thickness of about 20 Å to about 300 Å may be adequate depending on, for example, the material and the anticipated applications of the device.

Example embodiments relate to a method for fabricating the organic memory device. The organic memory device fabricated by the method of example embodiments may include forming a first electrode, forming a second electrode and forming an organic active layer extending between the first and second electrodes wherein the organic active layer may include two organic material layers.

Example embodiments of the methods include, for example, forming the organic active layer using simpler and economical techniques, e.g., conventional spin coating or spin casting, thereby reducing or eliminating the need for specialized equipment and fabrication processes, e.g., electron beam deposition, thereby tending to reduce the processing complexity and expense. Example embodiments of methods for fabricating the memory devices will typically include forming a second electrode on a substrate, coated with a suitable conductive material, and then an electrically non-conductive organic material containing heteroatoms, which is coated thereon to form a lower organic material layer. Subsequently, an electrically conductive organic material containing heteroatoms may be coated on the lower organic material layer to form an upper organic material layer. A first electrode may be formed on the organic active layer to complete the basic fabrication of the memory cells that will be incorporated in the organic memory device. The electrically conductive organic material containing heteroatoms and the electrically non-conductive organic material containing heteroatoms may be as explained above.

The formation procedure of the organic active layer may be explained below. An electrically non-conductive organic material, e.g., polyaniline and/or poly(4-vinylpyridine), containing heteroatoms may be coated on a second electrode (e.g. a bottom electrode), which may be formed on a substrate by deposition, to form a lower organic material layer. An electrically conductive organic material, e.g., poly(3-hexylthiophene), containing heteroatoms may be coated on the lower organic material layer to form an upper organic material layer. The material constituting the lower organic material layer may be selected from materials soluble in hydrophilic organic solvents, and the coating material constituting the upper organic material layer may be selected from materials soluble in hydrophobic solvents. Because the two constituent materials have a higher selectivity for solvents, the constituent material of the lower organic material layer may not be affected by the coating of the upper organic material layer.

The processes for coating processes the upper and lower organic material layers on the second electrode may not be particularly limited, and may include, for example, spin casting, spin coating, spray coating, electrostatic coating, dip coating, blade coating, roll coating and/or ink-jet printing. The thickness of the organic active layer will vary depending on the material, the intended use and the desired operating characteristics, but it is anticipated that organic active layers having a thickness of about 50 Å to about 3,000 Å may be suitable for most applications. At least one solvent selected from the group consisting of water, chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile and mixtures thereof may be used to form the upper organic material layer by spin coating. A solvent system or solvent mixture of two or more of the solvents in any miscible ratio may also be used.

At least one solvent selected from the group consisting of hydrophilic solvents, e.g., water, ethanol, methanol, 2-methoxyethyl alcohol, and 1,2-dichloroethane, may be used to form the lower organic material layer by spin coating. The first and second electrodes may be formed by known deposition, formation and/or coating processes, including deposition, e.g., thermal evaporation, sputtering, e-beam evaporation and spin coating.

Hereinafter, example embodiments will be explained in more detail with reference to the following examples. However, these examples may be given for the purpose of illustration and may not be construed as unduly limiting the scope of the disclosure or the following claims.

Example 1

Aluminum was deposited to a thickness of about 80 nm on a glass substrate by thermal evaporation, patterned and etched to form a second electrode. An aqueous solution of polyaniline (2 wt %) was spin-coated at about 1,500 rpm on the patterned second electrode, and baked at about 130° C. for about 30 minutes to form a lower organic material layer. Subsequently, a chlorobenzene solution of poly-3-hexylthiophene (P3HT, about 0.5-1 wt %) was spin-coated at about 1,500 rpm on the lower organic material layer, and then baked at about 110° C. for about 30 minutes to form an upper organic material layer. Copper was then deposited on the organic active layer to a thickness of about 80 nm by thermal evaporation, patterned and etched to form a first electrode, thereby completing fabrication of an organic memory device of example embodiments. During fabrication of this organic memory device, the thicknesses of the lower and upper organic material layers were controlled to about 40 nm and about 10 nm, respectively, as measured using an Alpha-Step™ profilometer. The thicknesses of the deposited electrodes were controlled using a quartz crystal monitor.

Examples 2 and 3

Memory devices were fabricated in the same manner as described above in connection with Example 1, with the exception that the materials and thicknesses of the upper and lower organic material layers were changed to those indicated in Table 1.

Comparative Examples 1 and 2

Memory devices were fabricated in the same manner as described above in Example 1, with the exception that the constituent materials and thicknesses of the upper and lower organic material layers were changed to those indicated in Table 1.

The constituent organic materials and thicknesses of the upper and lower organic material layers used in Examples 1 to 3 and Comparative Examples 1 and 2 are summarized in TABLE 1 below.

TABLE 1

| Example No. | Upper organic material layer | | Lower organic material layer | |
|---|---|---|---|---|
| | Material | Thickness (nm) | Material | Thickness (nm) |
| Example 1 | Poly-3-hexylthiophene | 10 | Polyaniline | 40 |
| Example 2 | Poly-3-hexylthiophene | 15 | Poly (4-vinylpyridine) | 40 |
| Example 3 | Poly-3-hexylthiophene | 30 | Poly (4-vinylpyridine) | 40 |
| Comparative Example 1 | Polyaniline | 15 | Poly (phenylenevinylene) | 40 |
| Comparative Example 2 | Poly-3-hexylthiophene | 30 | Polystyrene | 40 |

Test Example 1

Test for Switching Characteristics of Memory Devices

A voltage was applied to each of the memory devices fabricated in the manner described above in Examples 1 to 3 and Comparative Examples 1 and 2 to evaluate the switching characteristics as changes in current. The results of these tests are shown in FIGS. 4 to 9.

Figure 4:
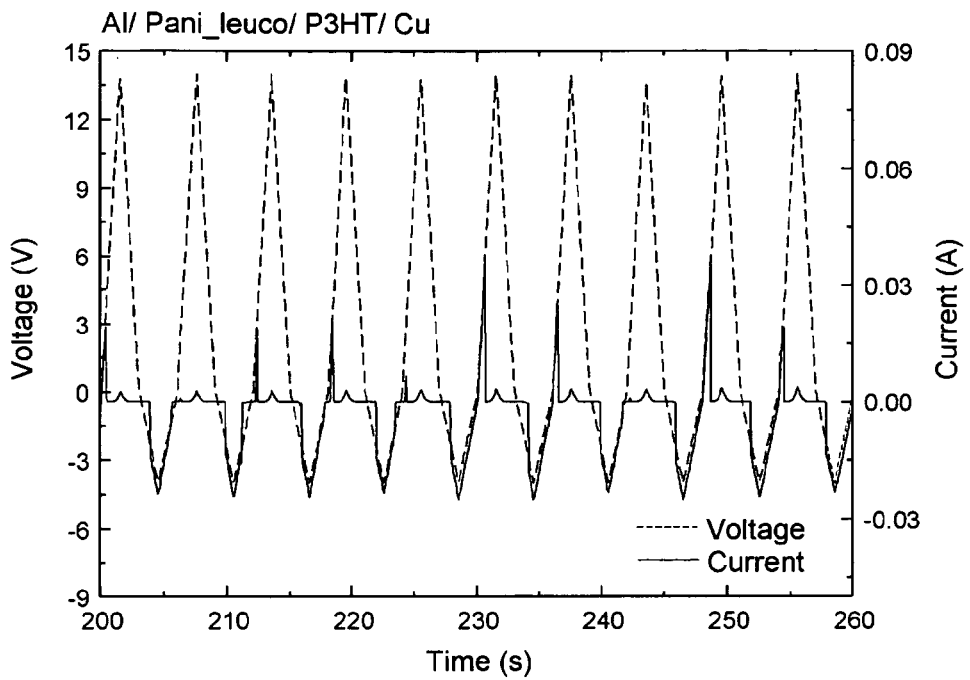
Figure 5:
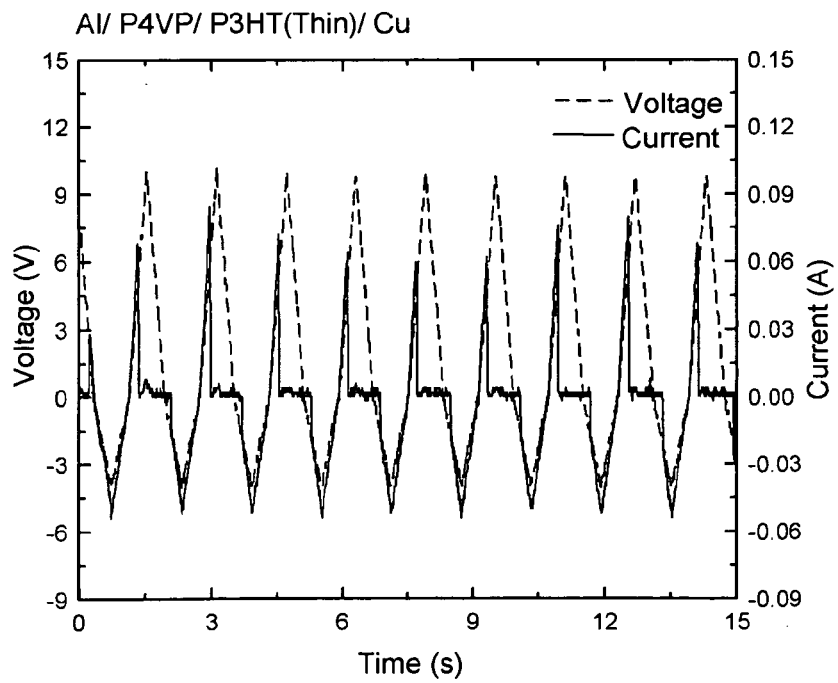
Figure 6:
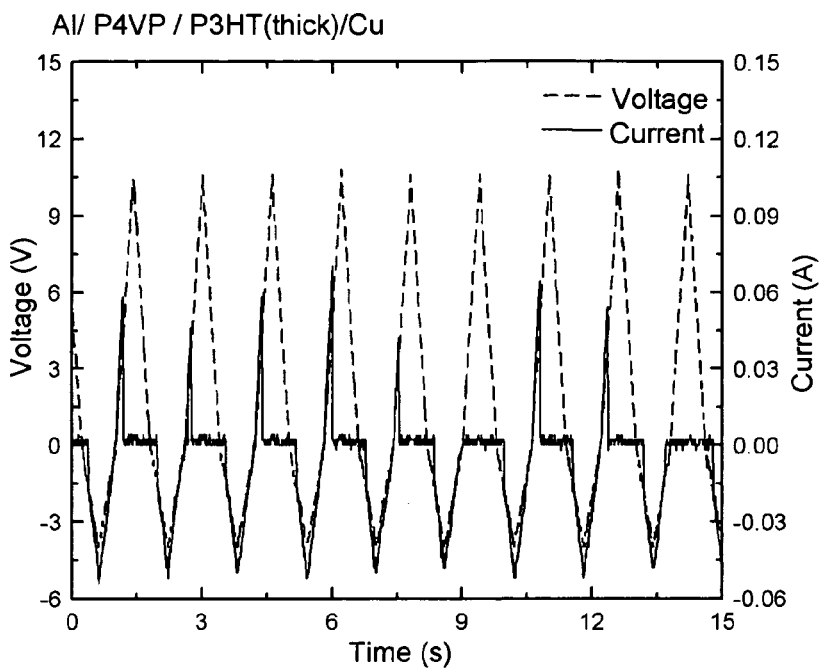
Figure 7:
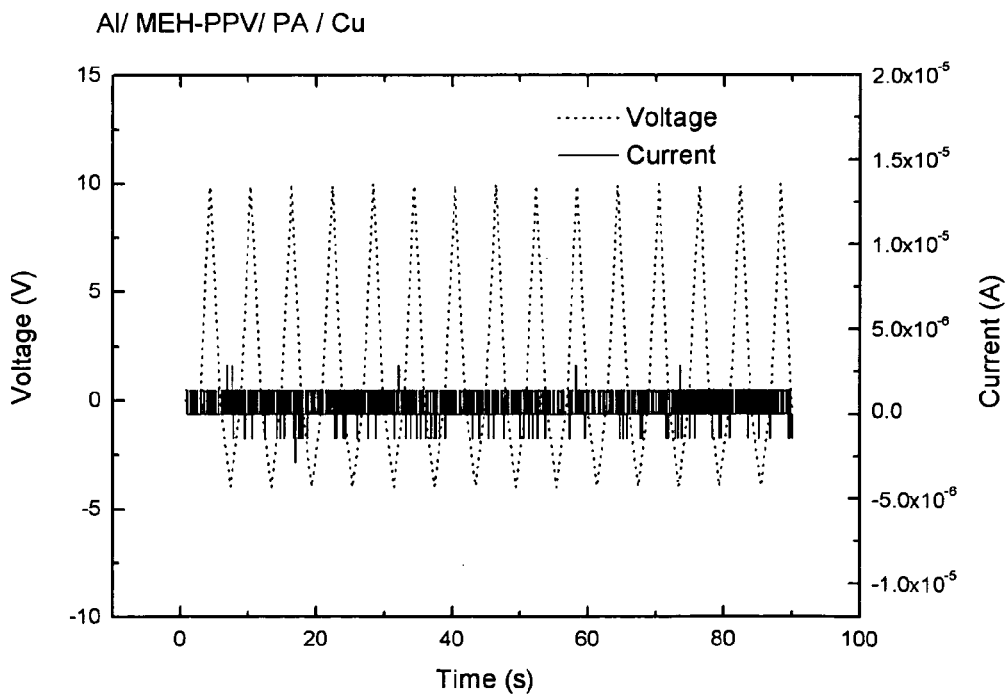
Figure 8:
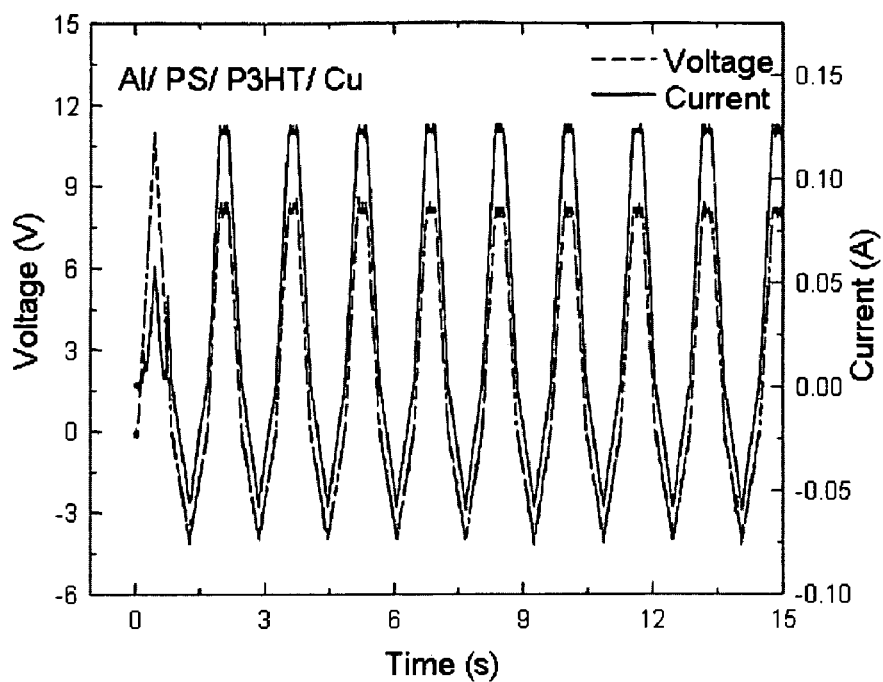
Figure 9:
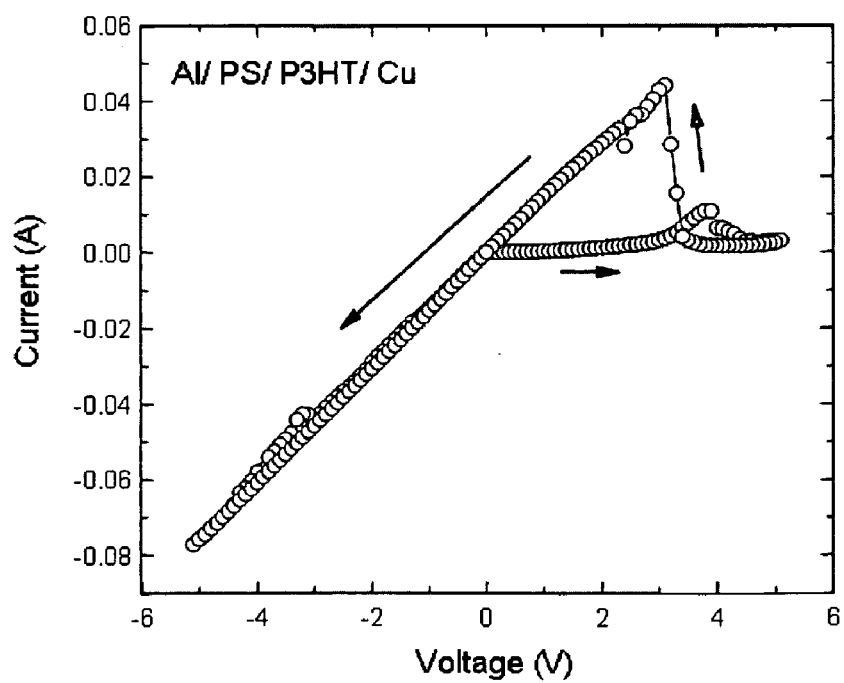

As is evident from the graphs shown in FIGS. 4 to 6, the organic memory devices, which include an upper organic material layer formed of an organic material containing heteroatoms and having an electrical conductivity of about $10^{-12}$ S/cm or greater and a lower organic material layer formed of an electrically non-conductive organic material containing heteroatoms, were capable of being switched between a higher resistance state and a lower resistance state in response to the voltage applied to the devices. In addition, the graphs of FIGS. 4 to 6 show that the switching phenomenon was reproducible as indicated by the ten cycles or more cycles illustrated for each of the organic memory devices. It was also observed that both of the two distinct resistance states may be maintained by the organic memory device even when no voltage or current was applied. In addition, because the resistance states may be read by monitoring current flow at relatively low voltages, the organic memory devices according to the Examples can be utilized as memory devices.

Although an upper organic material layer formed of an electrically conductive organic material and a lower organic material layer formed of an electrically non-conductive organic material containing heteroatoms were used to form the organic active layers, instead of using an expensive electrically conductive polymer, the memory devices of example embodiments showed switching characteristics.

In contrast, no metal filaments were formed in the memory device fabricated in Comparative Example 1 (see, FIG. 7), which may include an upper organic material layer formed of an electrically conductive organic material containing heteroatoms and a lower organic material layer formed of a general conductive polymer.

Further, no reproducible switching phenomenon was observed in the memory device fabricated in Comparative Example 2 (see, FIGS. 8 and 9), which may include an upper organic material layer formed of an electrically conductive organic material and a lower organic material layer formed of an electrically insulating polymer.

It could be confirmed from these results that the organic memory devices of example embodiments, which may include an organic active layer formed of an electrically conductive organic material containing heteroatoms and an electrically non-conductive organic material containing heteroatoms, which may be used to fabricate such organic memory devices using less complicated and/or less expensive fabrication processes including, for example, spin coating or spin casting, and showed improved switching characteristics.

As apparent from the above description, because the organic memory device of example embodiments exhibits improved thermal stability and non-volatility, it may be well suited for use in nonvolatile large-capacity storage units. Flexible electrodes may be used in the organic memory device of example embodiments to fabricate flexible memory devices.

Furthermore, a lower organic material layer of the organic memory device according to example embodiments may be formed using an inexpensive electrically non-conductive organic material containing heteroatoms, thus reducing the fabrication costs of the memory device.

Although the example embodiments have been disclosed for illustrative purposes, those skilled in the art will appreciate that various modifications and variations may be possible, without departing from the scope and spirit of example embodiments as disclosed in the appended claims. Accordingly, such modifications and variations may be intended to come within the scope of the claims.

What is claimed is:
1. An organic memory device comprising:
a first electrode;
an organic active layer on the first electrode, wherein the organic active layer includes an upper organic material layer formed of an electrically conductive organic material containing heteroatoms and a lower organic material layer formed of an electrically non-conductive organic material containing heteroatoms; and
a second electrode formed on the organic active layer,
wherein the organic active layer includes metal ions that are coordinated with the heteroatoms in the upper and lower organic material layers, wherein the electrically non-conductive organic material is selected from a group consisting of poly(4-vinylpyridine), poly(2-vinylpyridine), polystyrene-co-vinylpyridine, polystyrene sulfonic acid, polyacrylamide, poly(N-vinylimidazole) and mixtures thereof, and wherein the electrically conductive organic material includes a single molecule which includes a conductive moiety selected from a first group consisting of carbazole, triphenylamine, triphenyldiamine and mixtures thereof and which is bonded to a heteroatom-containing moiety selected from a group consisting of nitro, azo, indigo and thioindigo dyes and mixtures thereof.

2. The organic memory device according to claim 1, wherein the electrically conductive organic material has an electrical conductivity of about $10^{-12}$ S/cm or greater.

3. The organic memory device according to claim 1, wherein the heteroatoms contained in the electrically conductive organic material are selected from a group consisting of sulfur (S) and nitrogen (N).

4. The organic memory device according to claim 1, wherein the first electrode includes a conductive material independently selected from a group consisting of gold (Au), silver (Ag), platinum (Pt), copper (Cu), cobalt (Co), nickel (Ni), tin (Sn), aluminum (Al), and alloys, combinations and mixtures thereof.

5. The organic memory device according to claim 1, further comprising:
a barrier layer formed between the first electrode and the organic active layer or formed between the second electrode and the organic active layer.

6. The organic memory device according to claim 5, wherein the barrier layer comprises a material selected from a group consisting of $SiO_x$, $AlO_x$, $NbO_x$, $TiO_x$, $CrO_x$, $VO_x$, $TaO_x$, $CuO_x$, $MgO_x$, $WO_x$, $AlNO_x$, Alq3, polymethylmethacrylate, polystyrene, PET and mixtures thereof.

7. The organic memory device according to claim 6, wherein the barrier layer comprises a material selected from a group consisting of $SiO_2$, $Al_2O_3$, $Cu_2O$, $TiO_2$, $V_2O_3$, and mixtures and combinations thereof.

8. The organic memory device according to claim 5, wherein the barrier layer has a thickness of about 20 Å to about 300 Å.

9. A method for fabricating an organic memory device comprising:
forming a first electrode;
forming a second electrode;
forming an organic active layer extending between the first and second electrodes, wherein forming the organic active layer includes forming a lower organic material layer that includes an electrically non-conductive organic material containing heteroatoms on a substrate and forming an upper organic material layer that includes an electrically conductive organic material containing heteroatoms on the lower organic material layer; and providing metal ions in the upper and lower organic material layers under conditions whereby the metal ions become linked to the heteroatoms, wherein the electrically non-conductive organic material is selected from a group consisting of poly(4-vinylpyridine), poly(2-vinylpyridine), polystyrene-co-vinylpyridine, polystyrene sulfonic acid, polyacrylamide, poly(N-vinylimidazole) and mixtures thereof, and wherein the electrically conductive organic material includes a single molecule which includes a conductive moiety selected from a first group consisting of carbazole, triphenylamine, triphenyldiamine and mixtures thereof and which is bonded to a heteroatom-containing moiety selected from a group consisting of nitro azo indigo and thioindigo dyes and mixtures thereof.

10. The method according to claim 9, wherein forming the upper organic material layer includes applying a composition including an electrically conductive organic material containing heteroatoms to a surface of the lower organic material layer.

11. The method according to claim 10, wherein applying the composition to the surface of the lower organic material layer includes a process selected from a group consisting of spin casting, spin coating, spray coating, electrostatic coating, dip coating, blade coating, roll coating and combinations thereof.

12. The method according to claim 10, wherein forming the upper organic material layer includes coating the upper organic material layer using at least one solvent selected from a group consisting of water, chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile and mixtures and combinations thereof.

13. The method of fabricating an organic memory device according to claim 10, wherein:
the composition further comprises metal ions selected from a group consisting of the ions gold (Au), silver (Ag), platinum (Pt), copper (Cu), cobalt (Co), nickel (Ni), tin (Sn), aluminum (Al) and mixtures thereof.

14. The method of fabricating an organic memory device according to claim 13, wherein:
the metal ions are complexed or linked to the heteroatoms of the electrically conductive organic material.

15. The method according to claim 9, wherein forming the lower organic material layer includes coating the lower organic material layer using at least one solvent selected from a group consisting of water, ethanol, methanol, 2-methoxymethyl alcohol, 1,2-dichloroethane and mixtures and combinations thereof.

16. The method according to claim 9, further comprising:
diffusing metal ions from the first electrode through the organic active layer.

* * * * *